United States Patent
Roy

(10) Patent No.: US 8,988,153 B1
(45) Date of Patent: Mar. 24, 2015

(54) RING OSCILLATOR WITH NMOS OR PMOS VARIATION INSENSITIVITY

(71) Applicant: SuVolta, Inc., Los Gatos, CA (US)

(72) Inventor: Richard S. Roy, Dublin, CA (US)

(73) Assignee: SuVolta, Inc., Los Gatos, CA (US)

( * ) Notice: Subject to any disclaimer, the term of this patent is extended or adjusted under 35 U.S.C. 154(b) by 82 days.

(21) Appl. No.: 13/792,006

(22) Filed: Mar. 9, 2013

(51) Int. Cl.
H03K 3/03 (2006.01)

(52) U.S. Cl.
CPC ................................. *H03K 3/0315* (2013.01)
USPC .............. 331/57; 331/185; 331/2; 331/108 C; 327/537; 365/154; 365/189.011

(58) Field of Classification Search
CPC .................................................. H03K 3/0315
USPC .......................... 327/537; 331/57, 185, 2, 46; 365/189.011, 154
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,578,128 A | 3/1986 | Mundt et al. |
| 4,617,066 A | 10/1986 | Vasudev |
| 4,761,384 A | 8/1988 | Neppl et al. |
| 4,819,043 A | 4/1989 | Yazawa et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,298,763 A | 3/1994 | Shen et al. |
| 5,369,288 A | 11/1994 | Usuki |
| 5,384,476 A | 1/1995 | Nishizawa et al. |

(Continued)

FOREIGN PATENT DOCUMENTS

| | | |
|---|---|---|
| EP | 0274278 A1 | 7/1988 |
| JP | 59-193066 A | 11/1984 |

(Continued)

OTHER PUBLICATIONS

Abiko, H et al., "A Channel Engineering Combined with Channel Epitaxy Optimization and TED Suppression for 0.15μm n—n Gate CMOS Technology", 1995 Symposium on VLSI Technology Digest of Technical Papers, pp. 23-24, 1995.

(Continued)

*Primary Examiner* — Arnold Kinkead
(74) *Attorney, Agent, or Firm* — Darryl G. Walker

(57) ABSTRACT

A low voltage ring oscillator circuit can have a frequency variation that depends on process variations of insulated gate field effect transistors (IGFETs) of a first conductivity type without substantially being affected by process variations to IGFETs of a second conductivity type. A ring oscillator stage may include an inverter including only IGFETs of the first conductivity type. The inverter may be coupled to a boot circuit that boosts the gate potential of a first IGFET of the first conductivity type with a timing such that IGFETs of the second conductivity type in the boot circuit do not affect the frequency variations of the ring oscillator circuit.

17 Claims, 6 Drawing Sheets

(56) References Cited

U.S. PATENT DOCUMENTS

| | | |
|---|---|---|
| 5,559,368 A | 9/1996 | Hu et al. |
| 5,608,253 A | 3/1997 | Liu et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,889,315 A | 3/1999 | Farrenkopf et al. |
| 5,895,954 A | 4/1999 | Yasumura et al. |
| 5,923,987 A | 7/1999 | Burr |
| 5,989,963 A | 11/1999 | Luning et al. |
| 6,020,227 A | 2/2000 | Bulucea |
| 6,087,210 A | 7/2000 | Sohn |
| 6,087,691 A | 7/2000 | Hamamoto |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,218,895 B1 | 4/2001 | De et al. |
| 6,229,188 B1 | 5/2001 | Aoki et al. |
| 6,245,618 B1 | 6/2001 | An et al. |
| 6,288,429 B1 | 9/2001 | Iwata et al. |
| 6,300,177 B1 | 10/2001 | Sundaresan et al. |
| 6,313,489 B1 | 11/2001 | Letavic et al. |
| 6,320,222 B1 | 11/2001 | Forbes et al. |
| 6,326,666 B1 | 12/2001 | Bernstein et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,279 B1 | 7/2002 | Huster et al. |
| 6,444,550 B1 | 9/2002 | Hao et al. |
| 6,444,551 B1 | 9/2002 | Ku et al. |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,506,640 B1 | 1/2003 | Ishida et al. |
| 6,518,623 B1 | 2/2003 | Oda et al. |
| 6,534,373 B1 | 3/2003 | Yu |
| 6,541,829 B2 | 4/2003 | Nishinohara et al. |
| 6,548,842 B1 | 4/2003 | Bulucea et al. |
| 6,551,885 B1 | 4/2003 | Yu |
| 6,573,129 B2 | 6/2003 | Hoke et al. |
| 6,597,218 B1 | 7/2003 | Gauthier et al. |
| 6,600,200 B1 | 7/2003 | Lustig et al. |
| 6,620,671 B1 | 9/2003 | Wang et al. |
| 6,624,488 B1 | 9/2003 | Kim |
| 6,630,710 B1 | 10/2003 | Augusto |
| 6,660,605 B1 | 12/2003 | Liu |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,753,230 B2 | 6/2004 | Sohn et al. |
| 6,770,944 B2 | 8/2004 | Nishinohara et al. |
| 6,797,994 B1 | 9/2004 | Hoke et al. |
| 6,808,994 B1 | 10/2004 | Wang |
| 6,812,527 B2 | 11/2004 | Dennard et al. |
| 6,821,825 B2 | 11/2004 | Todd et al. |
| 6,822,297 B2 | 11/2004 | Nandakumar et al. |
| 6,831,292 B2 | 12/2004 | Currie et al. |
| 6,881,641 B2 | 4/2005 | Wieczorek et al. |
| 6,881,987 B2 | 4/2005 | Sohn |
| 6,893,947 B2 | 5/2005 | Martinez et al. |
| 6,916,698 B2 | 7/2005 | Mocuta et al. |
| 6,930,007 B2 | 8/2005 | Bu et al. |
| 6,930,360 B2 | 8/2005 | Yamauchi et al. |
| 6,963,090 B2 | 11/2005 | Passlack et al. |
| 6,967,522 B2 | 11/2005 | Chandrakasan et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,515 B2 | 8/2006 | Hanafi et al. |
| 7,119,381 B2 | 10/2006 | Passlack |
| 7,170,120 B2 | 1/2007 | Datta et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,235,822 B2 | 6/2007 | Li |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,427,788 B2 | 9/2008 | Li et al. |
| 7,442,971 B2 | 10/2008 | Wirbeleit et al. |
| 7,462,908 B2 | 12/2008 | Bol et al. |
| 7,485,536 B2 | 2/2009 | Jin et al. |
| 7,491,988 B2 | 2/2009 | Tolchinsky et al. |
| 7,494,861 B2 | 2/2009 | Chu et al. |
| 7,498,637 B2 | 3/2009 | Yamaoka et al. |
| 7,501,324 B2 | 3/2009 | Babcock et al. |
| 7,507,999 B2 | 3/2009 | Kusumoto et al. |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,412 B2 | 5/2009 | Schulze et al. |
| 7,564,105 B2 | 7/2009 | Chi et al. |
| 7,592,241 B2 | 9/2009 | Takao |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,642,140 B2 | 1/2010 | Bae et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,675,126 B2 | 3/2010 | Cho |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,844 B2 | 4/2010 | Zhu et al. |
| 7,709,828 B2 | 5/2010 | Braithewaite et al. |
| 7,723,750 B2 | 5/2010 | Zhu et al. |
| 7,728,677 B2 | 6/2010 | Logan |
| 7,750,405 B2 | 7/2010 | Nowak |

(56) References Cited

U.S. PATENT DOCUMENTS

| | | | |
|---|---|---|---|
| 7,750,682 B2 | 7/2010 | Bernstein et al. | |
| 7,755,146 B2 | 7/2010 | Helm et al. | |
| 7,759,714 B2 | 7/2010 | Itoh et al. | |
| 7,795,677 B2 | 9/2010 | Bangsaruntip et al. | |
| 7,818,702 B2 | 10/2010 | Mandelman et al. | |
| 7,829,402 B2 | 11/2010 | Matocha et al. | |
| 7,867,835 B2 | 1/2011 | Lee et al. | |
| 7,883,977 B2 | 2/2011 | Babcock et al. | |
| 7,888,747 B2 | 2/2011 | Hokazono | |
| 7,897,495 B2 | 3/2011 | Ye et al. | |
| 7,906,413 B2 | 3/2011 | Cardone et al. | |
| 7,906,813 B2 | 3/2011 | Kato | |
| 7,919,791 B2 | 4/2011 | Flynn et al. | |
| 7,948,008 B2 | 5/2011 | Liu et al. | |
| 7,952,147 B2 | 5/2011 | Ueno et al. | |
| 7,960,232 B2 | 6/2011 | King et al. | |
| 7,960,238 B2 | 6/2011 | Kohli et al. | |
| 7,968,400 B2 | 6/2011 | Cai | |
| 7,968,411 B2 | 6/2011 | Williford | |
| 8,004,024 B2 | 8/2011 | Furukawa et al. | |
| 8,012,827 B2 | 9/2011 | Yu et al. | |
| 8,039,332 B2 | 10/2011 | Bernard et al. | |
| 8,048,791 B2 | 11/2011 | Hargrove et al. | |
| 8,048,810 B2 | 11/2011 | Tsai et al. | |
| 8,067,279 B2 | 11/2011 | Sadra et al. | |
| 8,105,891 B2 | 1/2012 | Yeh et al. | |
| 8,106,424 B2 | 1/2012 | Schruefer | |
| 8,106,481 B2 | 1/2012 | Rao | |
| 8,119,482 B2 | 2/2012 | Bhalla et al. | |
| 8,120,069 B2 | 2/2012 | Hynecek | |
| 8,129,246 B2 | 3/2012 | Babcock et al. | |
| 8,129,797 B2 | 3/2012 | Chen et al. | |
| 8,134,159 B2 | 3/2012 | Hokazono | |
| 8,143,120 B2 | 3/2012 | Kerr et al. | |
| 8,143,124 B2 | 3/2012 | Challa et al. | |
| 8,143,678 B2 | 3/2012 | Kim et al. | |
| 8,148,774 B2 | 4/2012 | Mori et al. | |
| 8,163,619 B2 | 4/2012 | Yang et al. | |
| 8,173,502 B2 | 5/2012 | Yan et al. | |
| 8,174,282 B2 | 5/2012 | Fujii et al. | |
| 8,178,430 B2 | 5/2012 | Kim et al. | |
| 8,183,096 B2 | 5/2012 | Wirbeleit | |
| 8,183,107 B2 | 5/2012 | Mathur et al. | |
| 8,236,661 B2 | 8/2012 | Dennard et al. | |
| 8,354,671 B1 | 1/2013 | Im et al. | |
| 8,415,744 B2 | 4/2013 | Cai et al. | |
| 8,419,274 B2 | 4/2013 | Chen et al. | |
| 2001/0014495 A1 | 8/2001 | Yu | |
| 2003/0122203 A1 | 7/2003 | Nishinohara et al. | |
| 2003/0183856 A1 | 10/2003 | Wieczorek et al. | |
| 2004/0075118 A1 | 4/2004 | Heinemann et al. | |
| 2004/0084731 A1 | 5/2004 | Matsuda et al. | |
| 2005/0048703 A1 | 3/2005 | Dennard et al. | |
| 2005/0116282 A1 | 6/2005 | Pattanayak et al. | |
| 2005/0250289 A1 | 11/2005 | Babcock et al. | |
| 2006/0022270 A1 | 2/2006 | Boyd et al. | |
| 2006/0049464 A1 | 3/2006 | Rao | |
| 2006/0068555 A1 | 3/2006 | Zhu et al. | |
| 2006/0068586 A1 | 3/2006 | Pain | |
| 2006/0071278 A1 | 4/2006 | Takao | |
| 2006/0154428 A1 | 7/2006 | Dokumaci | |
| 2007/0040222 A1 | 2/2007 | Van Camp et al. | |
| 2007/0158790 A1 | 7/2007 | Rao | |
| 2007/0238253 A1 | 10/2007 | Tucker | |
| 2008/0067589 A1 | 3/2008 | Ito et al. | |
| 2008/0169493 A1 | 7/2008 | Lee et al. | |
| 2008/0197439 A1 | 8/2008 | Goerlach et al. | |
| 2008/0227250 A1 | 9/2008 | Ranade et al. | |
| 2008/0258198 A1 | 10/2008 | Bojarczuk et al. | |
| 2008/0272409 A1 | 11/2008 | Sonkusale et al. | |
| 2009/0057746 A1 | 3/2009 | Sugll et al. | |
| 2009/0108350 A1 | 4/2009 | Cai et al. | |
| 2009/0134468 A1 | 5/2009 | Tsuchiya et al. | |
| 2009/0302388 A1 | 12/2009 | Cai et al. | |
| 2009/0311837 A1 | 12/2009 | Kapoor | |
| 2009/0321849 A1 | 12/2009 | Miyamura et al. | |
| 2010/0012988 A1 | 1/2010 | Yang et al. | |
| 2010/0038724 A1 | 2/2010 | Anderson et al. | |
| 2010/0187641 A1 | 7/2010 | Zhu et al. | |
| 2011/0012672 A1 | 1/2011 | Ogawa | |
| 2011/0073961 A1 | 3/2011 | Dennard et al. | |
| 2011/0074498 A1 | 3/2011 | Thompson et al. | |
| 2011/0079860 A1 | 4/2011 | Verhulst | |
| 2011/0079861 A1 | 4/2011 | Shifren et al. | |
| 2011/0169082 A1 | 7/2011 | Zhu et al. | |
| 2011/0175170 A1 | 7/2011 | Wang et al. | |
| 2011/0180880 A1 | 7/2011 | Chudzik et al. | |
| 2011/0193164 A1 | 8/2011 | Zhu | |
| 2012/0021594 A1 | 1/2012 | Gurtei et al. | |
| 2012/0056275 A1 | 3/2012 | Cai et al. | |
| 2012/0108050 A1 | 5/2012 | Chen et al. | |
| 2012/0190177 A1 | 7/2012 | Kim et al. | |
| 2012/0327725 A1* | 12/2012 | Clark et al. | 365/189.011 |

FOREIGN PATENT DOCUMENTS

| | | |
|---|---|---|
| JP | 4-186774 A | 7/1992 |
| JP | 8-153873 A | 6/1996 |
| JP | 8-288508 A | 11/1996 |
| JP | 2004087671 A | 3/2004 |
| WO | 2011/062788 A1 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content Si1-yCy Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-µm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

(56) References Cited

OTHER PUBLICATIONS

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

* cited by examiner

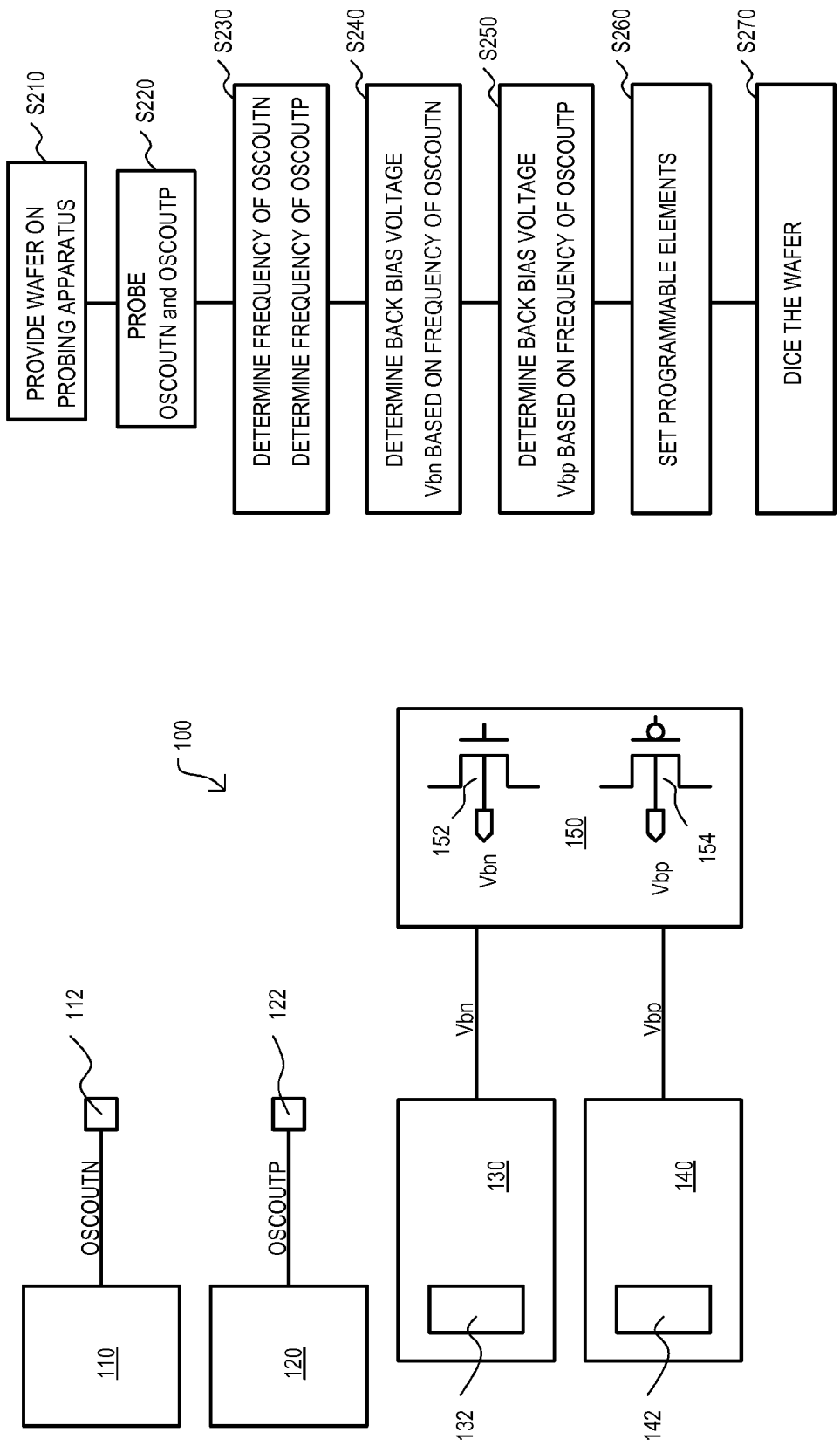

| N-channel Oscillator | | |
|---|---|---|
| N-channel IGFET | P-channel IGFET | Period |
| Fast | Fast | 3.545 ns |
| Fast | Slow | 3.518 ns |
| Slow | Fast | 6.969 ns |
| Slow | Slow | 6.725 ns |
| Typical | Typical | 5.0 ns |

FIG. 9

| P-channel Oscillator | | |
|---|---|---|
| P-channel IGFET | N-channel IGFET | Period |
| Fast | Fast | 6.546 ns |
| Fast | Slow | 6.45 ns |
| Slow | Fast | 17.833 ns |
| Slow | Slow | 16.366 ns |
| Typical | Typical | 9.867 ns |

FIG. 10

RING OSCILLATOR WITH NMOS OR PMOS VARIATION INSENSITIVITY

TECHNICAL FIELD

The present invention relates generally to ring oscillators, and more particularly to a ring oscillator that can be used to optimize transistor characteristics.

BACKGROUND OF THE INVENTION

Process variations can cause component characteristics on a semiconductor die to greatly vary. In particular, with complementary components, such as n-channel and p-channel metal oxide semiconductor field effect transistors (MOSFETs), one component type may have a process variation such that one of the conductivity type components may be at a fast operation, while the other component may be at a slow operation. In yet another case, both conductivity type components may be a fast operation. Lastly, both conductivity type component may be at a slow operation.

In this way, a circuit designer must design circuitry to operate at all of the four corners (e.g. fast p-channel, fast n-channel: fast p-channel, slow n-channel, slow p-channel, fast n-channel: and slow p-channel, slow n-channel). Such variations must be compensated by designing circuitry to operate with an adequate margin. By doing so, circuitry may not be designed for optimal speed and/or power.

In view of the above, it would be desirable to provide a way of compensating for process variations such that circuits may be optimized for speed and/or power regardless as to where within the four corners of process variation the particular device may fall.

BRIEF DESCRIPTION OF THE DRAWINGS

FIG. 1 is a schematic diagram of a semiconductor circuit according to a first embodiment.

FIG. 2 is a flow diagram of a method of determining and setting body bias potentials.

FIG. 9 is a table illustrating simulation results.

FIG. 10 is a table illustrating simulation results.

DETAILED DESCRIPTION OF THE EMBODIMENTS

Figure 4:
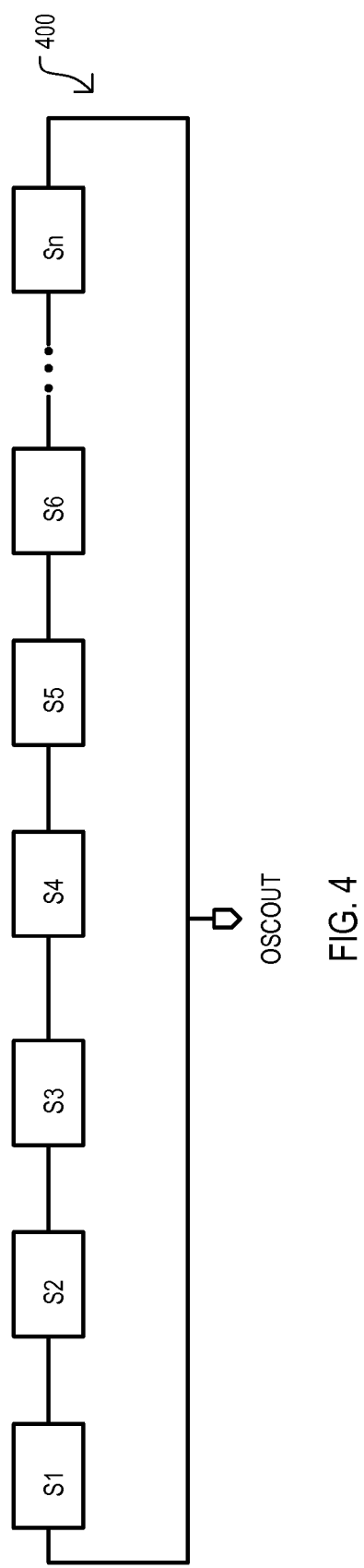
FIG. 4 is a block diagram of a ring oscillator according to an embodiment.

Various embodiments of the present invention will now be described in detail with reference to a number of drawings. The embodiments show ring oscillator circuits and methods constructed with insulated gate field effect transistors (IGFETs), for example IGFETs of complementary conductivity types (n-channel and p-channel types). In particular, the embodiments may include implementations using IGFETs having substantially lower absolute value of threshold voltage $V_T$, e.g. about 0.4 volts for n-channel IGFETs and about −0.4 volts for p-channel IGFETs as compared to about 0.6 volts and −0.6 volts, respectively. Such low threshold voltage IGFETs may comprise DDC technology, as but one example. DDC transistors are particularly advantageous for the embodiments herein based on the ability to reliably set threshold voltage with substantially reduced variation compared with conventional planar CMOS transistors. DDC transistors are also amenable to be designed with reduced threshold voltage, based upon, among other device design attributes, there being a heavily doped region and structure below a substantially undoped channel. Further discussion regarding transistor structure and methods of implementation is provided in U.S. Pat. No. 8,273,617 entitled ELECTRONIC DEVICES AND SYSTEMS, AND METHODS FOR MAKING AND USING THE SAME, which disclosure is incorporated by reference herein in its entirety.

Referring now to FIG. 1, a semiconductor circuit according to a first embodiment is set forth in a block schematic diagram, and designated by the general reference character 100. Semiconductor circuit 100 can include ring oscillators (110 and 120), and voltage generators (130 and 140), and device circuits 150.

Referring to FIG. 1, ring oscillator 110 may provide an oscillator output OSCOUTN to a pad 112. Oscillator output OSCOUTN may have a frequency that varies substantially in response to process variations of the performance of n-channel IGFETs without substantial frequency variation in response to process variations of the performance of p-channel IGFETs.

Ring oscillator 120 may provide an oscillator output OSCOUTP to a pad 122. Oscillator output OSCOUTP may have a frequency that varies substantially in response to process variations of the performance of p-channel IGFETs without substantial frequency variation in response to process variations of the performance of n-channel IGFETs.

Voltage generator 130 can provide a body bias potential Vbn to devices 150. Voltage generator 130 can include a programmable circuit 132. The body bias potential Vbn can have a predetermined potential that is essentially set in accordance to the programming state of the programmable circuit 132. Programmable circuit 132 can include programmable elements such as fuses, antifuses, or non-volatile memory cells, as just a few examples.

Voltage generator 140 can provide a body bias potential Vbp to devices 150. Voltage generator 140 can include a programmable circuit 142. The body bias potential Vbp can have a predetermined potential that is essentially set in accordance to the programming state of the programmable circuit 142. Programmable circuit 142 can include programmable elements such as fuses, antifuses, or non-volatile memory cells, as just a few examples.

Devices 150 can include n-channel IGFETs 152 and p-channel IGFETs 154. IGFETs (152 and 154) can include billions of IGFETs (152 and 154) integrally connected to form functional circuitry on an circuit block or die. N-channel IGFETs 152 can be one conductivity type and p-channel IGFETs 154 may be another conductivity type.

N-channel IGFETs 152 can receive body bias potential Vbn at a body bias terminal. The body bias potential Vbn may effect the operation of the n-channel IGFETs 152 based upon the magnitude of the body bias potential Vbn. As just one example, the threshold voltage ($V_T$) of n-channel IGFETs 152 can change in response to changes in the body bias potential Vbn.

P-channel IGFETs 154 can receive body bias potential Vbp at a body bias terminal. The body bias potential Vbp may effect the operation of the p-channel IGFETs 152 based upon the magnitude of the body bias potential Vbp. As just one example, the threshold voltage ($V_T$) of p-channel IGFETs 154 can change in response to changes in the body bias potential Vbp.

A method of setting the body bias potentials (Vbn and Vbp) will now be discussed with reference to FIG. 2 in conjunction with FIG. 1. Referring now to FIG. 2, a method of determining and setting the body bias potentials (Vbn and Vbp) according to an embodiment is set forth in a flow diagram.

At step S210, the process may start by providing a wafer including the semiconductor circuit 100 on a probe apparatus. The probe apparatus may provide probe contacts to pads (112 and 122) at step S220. At step S230, a frequency of oscillator output OSCOUTN and oscillator output OSCOUTP may be determined. At step S240, a predetermined body bias potential Vbn may be selected based on the frequency of oscillator output OSCOUTN. At step S250, a predetermined body bias potential Vbp may be selected based on the frequency of oscillator output OSCOUTP. At step S260, programmable elements in programmable circuits (132 and 142) may be programmed such that voltage generators (130 and 140) may provide predetermined body bias potentials (Vbn and Vbp), respectively. At step S270 the wafer may be diced along scribe lines and the ring oscillator circuits (110 and 120) may be destroyed. The step of dicing may be performed with a mechanical saw blade or with a laser. Furthermore, the step of dicing may include partially cutting through scribe lines and then breaking the wafer apart using a tensile force by expanding a compliant layer upon which the wafer is bonded.

With proper selection of the body bias potentials (Vbn and Vbp), n-channel IGFETs 152 and p-channel IGFETs 154 may operate like "typical" IGFETs, even when the process variations provide IGFETs operating at one of the extreme corners. In this way, the design may be optimized for predetermined "typical" IGFET characteristics without the need to design for an adequate margin to allow for functionality at the extreme corner transistor characteristics based on process variations. By doing so, speed and power may be better optimized.

The semiconductor circuit 100 of FIG. 1 may be a low voltage semiconductor circuit having a power supply below about 1.0 volts. The operational power supply may be about 0.6 volts.

When semiconductor circuit 100 includes essentially worst case slow corner n-channel IGFETS 152, ring oscillator 110 may have frequency that is relatively low. When semiconductor circuit 100 includes essentially worst case fast corner n-channel IGFETS 152, ring oscillator 110 may have frequency that is relatively high. When semiconductor circuit 100 includes essentially normal or typical (as opposed to fast or slow) n-channel IGFETS 152, ring oscillator 110 may have frequency that is between the relatively low and relatively high frequencies.

In a semiconductor circuit 100 having normal or typical n-channel IGFETs 152, programmable circuits 132 in voltage generator 130 may be configured or programmed such that voltage generator may provide a body bias potential Vbn of about −0.3 volts. However, in the case of essentially worst case slow corner n-channel IGFETs 152, programmable circuits 132 in voltage generator 130 may be configured or programmed such that voltage generator may provide a body bias potential Vbn of about 0.0 volts. In the case of essentially worst case fast corner n-channel IGFETs 152, programmable circuits 132 in voltage generator 130 may be configured or programmed such that voltage generator may provide a body bias potential Vbn of about −0.6 volts. In the case of n-channel IGFETs 152 that are between the essentially worst case slow corner and normal or typical n-channel IGFETs, programmable circuits 132 in voltage generator 130 may be configured or programmed such that voltage generator 130 may provide a body bias potential Vbn of, for instance, between about 0.0 volts and about −0.3 volts. In the case of n-channel IGFETs 152 that are between the essentially worst case fast corner and normal or typical n-channel IGFETs, programmable circuits 132 in voltage generator 130 may be configured or programmed such that voltage generator 130 may provide a body bias potential Vbn of, for instance, between about −0.3 volts and about −0.6 volts.

In this way, n-channel IGFETs 152 that are slower than normal or typical may be sped up to behave like normal or typical n-channel IGFETs 152 by shifting the threshold voltage $V_T$ to a lower setting and n-channel IGFETs 152 that are faster than normal or typical may be slowed down to behave like normal or typical n-channel IGFETs 152 up by shifting the threshold voltage $V_T$ to a higher setting.

When semiconductor circuit 100 includes essentially worst case slow corner p-channel IGFETS 154, ring oscillator 120 may have frequency that is relatively low. When semiconductor circuit 100 includes essentially worst case fast corner p-channel IGFETS 154, ring oscillator 120 may have frequency that is relatively high. When semiconductor circuit 100 includes essentially normal or typical p-channel IGFETS 154, ring oscillator 120 may have frequency that is between the relatively low and relatively high frequencies.

In a semiconductor circuit 100 having normal or typical p-channel IGFETs 154, programmable circuits 142 in voltage generator 140 may be configured or programmed such that voltage generator may provide a body bias potential Vbp of, for instance, about a power supply potential plus 0.3 volts. However, in the case of essentially worst case slow corner p-channel IGFETs 154, programmable circuits 142 in voltage generator 140 may be configured or programmed such that voltage generator may provide a body bias potential Vbp of, for instance, about a power supply potential. In the case of essentially worst case fast corner p-channel IGFETs 154, programmable circuits 142 in voltage generator 140 may be configured or programmed such that voltage generator may provide a body bias potential Vbp of about, for instance, a power supply potential plus 0.6 volts. In the case of p-channel IGFETs 154 that are between the essentially worst case slow corner and normal or typical p-channel IGFETs, programmable circuits 142 in voltage generator 140 may be configured or programmed such that voltage generator may provide a body bias potential Vbp of, for instance, between about a power supply potential and a power supply potential plus 0.3 volts. In the case of p-channel IGFETs 154 that are between the essentially worst case fast corner and normal or typical p-channel IGFETs, programmable circuits 142 in voltage generator 140 may be configured or programmed such that voltage generator may provide a body bias potential Vbp of, for instance, between about a power supply potential plus 0.3 volts and about a power supply potential plus 0.6 volts.

In this way, p-channel IGFETs 154 that are slower than normal or typical may be sped up to behave like normal or typical p-channel IGFETs 154 by shifting the threshold voltage $V_T$ to a lower magnitude and p-channel IGFETs 154 that are faster than normal or typical may be slowed down to behave like normal or typical p-channel IGFETs 154 up by shifting the threshold voltage $V_T$ to a higher magnitude.

Figure 3:
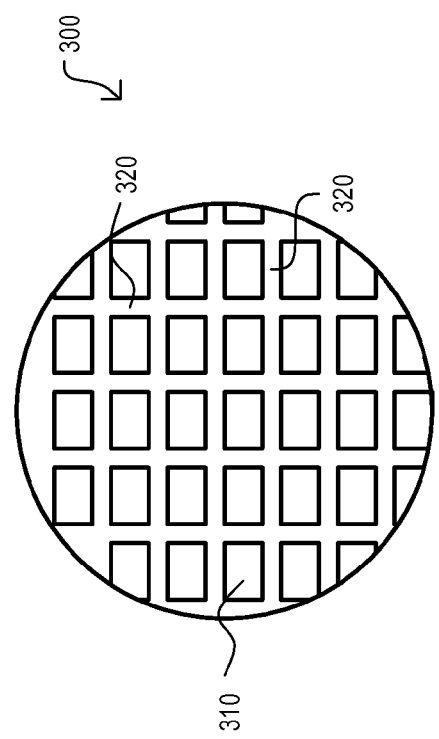
FIG. 3 is a top schematic view of a contiguous wafer according to an embodiment.

Referring now to FIG. 3, a wafer according to an embodiment is set forth in a top schematic view and designated by the general reference character 300.

Semiconductor circuit 100 of FIG. 1 may be at least a portion of a contiguous wafer 300 including semiconductor chips formed in a grid fashion and connected by scribe lines 320 running in a horizontal and vertical pattern between semiconductor chips 310 arranged in a matrix.

In one embodiment, the ring oscillators (110 and 120) and pads (112 and 122) of semiconductor circuit 100 in FIG. 1, may be included in a scribe line 330. Voltage generators (120 and 130) and circuits 140 may be included in each semiconductor chip 310. After the method of setting the body bias potentials (Vbn and Vbp) of FIG. 2 is completed, the semiconductor chips may be separated with a dicing method by mechanical saw or laser in which the scribe lines may be destroyed. In this way, the ring oscillators (110 and 120) and pads (112 and 122) may be destroyed and valuable area on the semiconductor chip 310 may not be wasted and circuit area may be reduced.

Referring now to FIG. 4, a ring oscillator according to an embodiment is set forth in a block schematic diagram and designated by the general reference character 400. Ring oscillator 400 can include n stages (S1 to Sn) connected in series with the output of the last stage Sn connected back to the input of the first stage S1. To provide the proper negative feedback for a ring oscillator, n must be an odd number and each stage (S1 to Sn) must be an inverting stage.

Figure 5:
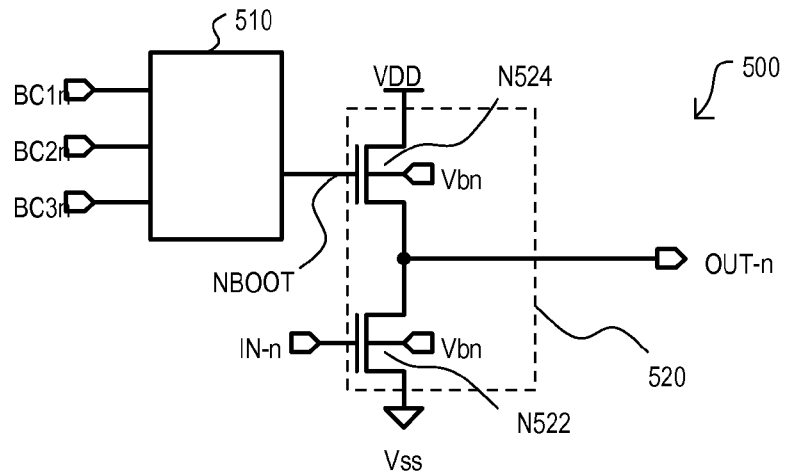
FIG. 5 is a circuit schematic diagram of a ring oscillator stage according to an embodiment.

Referring now to FIG. 5, a ring oscillator stage according to an embodiment is set forth in a circuit schematic diagram and designated by the general reference character 500. Ring oscillator stage 500 may be used for stages (S1 to Sn) in a construction of ring oscillator 400 of FIG. 4. In particular, ring oscillator 400 of FIG. 4, configured with ring oscillator stage 500 may be used as ring oscillator 110 in semiconductor circuit 100 of FIG. 1.

Ring oscillator stage 500 may include a boot circuit 510 and an inverter 520. Boot circuit 510 may receive boot control signals (BC1n, BC2n, and BC3n) and may provide a booted output signal at a boot node NBOOT. Inverter 520 may receive the booted output signal at boot node NBOOT and an input signal IN-n as inputs and may provide an output signal OUT-n as an output.

Inverter 520 may include n-channel IGFETs (N522 and N524). N-channel IGFET N522 may have a source terminal connected to a ground potential, a drain terminal commonly connected to a source terminal of n-channel IGFET N524, and a gate connected to receive input signal IN-n. N-channel IGFET N524 may have a gate terminal connected to boot node NBOOT and a drain terminal connected to a power supply potential VDD. Each n-channel IGFET (N522 and N524) may have a body terminal connected to a body bias potential Vbn. N-channel IGFET N522 may have a channel region that is substantially greater drive strength than n-channel IGFET N524. As just one example, the width/length ratio of the gate region connected to the gate terminal of n-channel IGFET N522 may be about 8 times larger than the gate region of n-channel IGFET N524.

Figure 6:
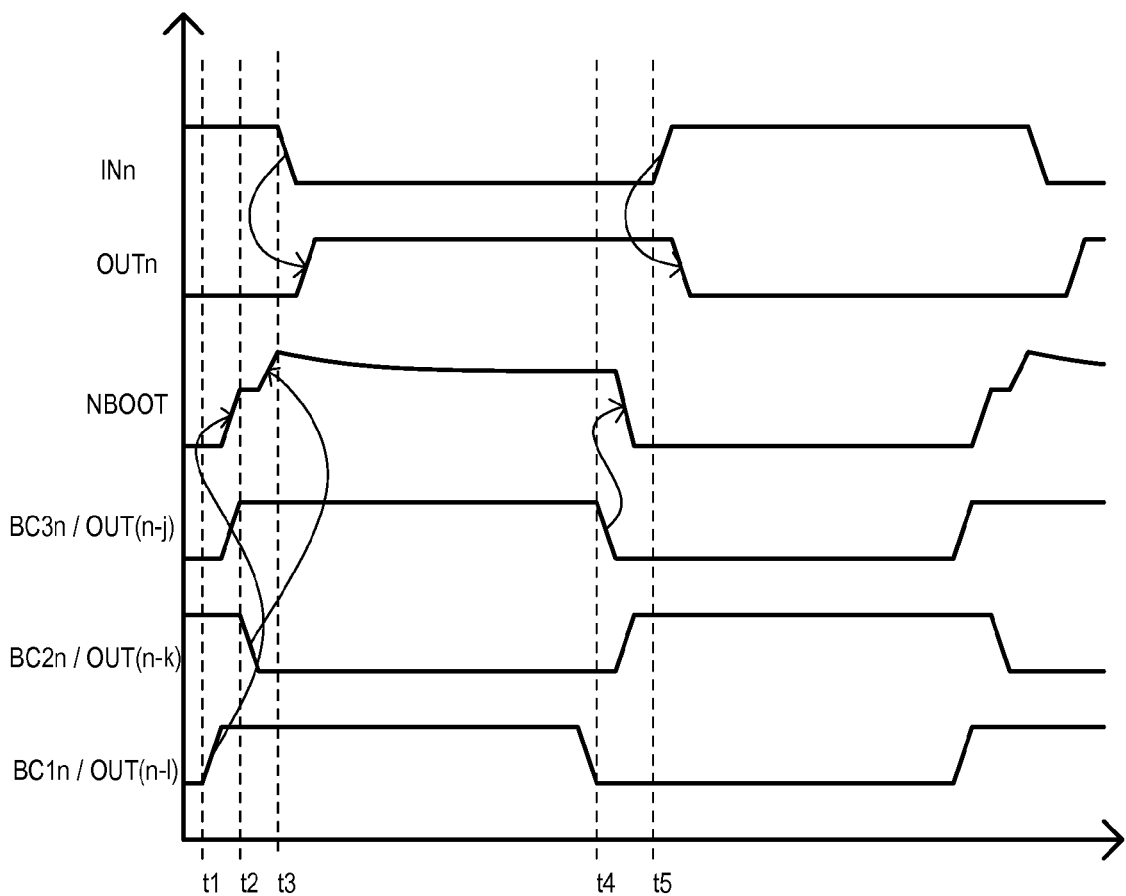
FIG. 6 is a timing diagram illustrating the operation of a ring oscillator stage.

The operation of ring oscillator stage 500 will now be explained by referring to FIG. 5 in conjunction with FIG. 6. FIG. 6 is a timing diagram illustrating the operation of ring oscillator stage 500.

At time t1, input signal IN-n may be at a power supply potential VDD. Because the gate terminal of n-channel IGFET N522 is receiving the power supply level, n-channel IGFET N522 may be turned on and output signal OUT-n may be driven to a ground potential VSS. Also at t1 boot control signal BC1n may transition from a low logic level (ground potential VSS) to a high logic level (power supply potential VDD). In response to the low to high transition of boot control signal BC1n, boot node NBOOT may transition from a logic low level to a power supply potential VDD. At this time, n-channel IGFET N524 may turn on. However, because n-channel IGFET N522 has a substantially greater drive strength than n-channel IGFET N524, output signal OUT-n may remain substantially at a ground potential VSS.

The ring oscillator stage 500 may be a low voltage ring oscillator stage in which power supply potential VDD may be below 1.0 volt. Power supply potential VDD may be about 0.6 volts, as one particular example.

At time t2, boot control signal BC2 may transition from a high logic level to a low logic level. In response to the high to low transition of boot control signal BC2n, boot node NBOOT may transition to a booted potential, substantially above power supply potential VDD. In this way, n-channel IGFET N524 may turn on harder. However, because n-channel IGFET N522 has a substantially greater drive strength than n-channel IGFET N524, output signal OUT-n may remain substantially at a ground potential VSS.

At time t3, input signal IN-n may transition from a power supply potential VDD to essentially a ground potential VSS. With input signal IN-n at a ground potential, n-channel IGFET N522 may be turned off. With n-channel IGFET N522 turned off, n-channel IGFET N524 may be allowed to pull output signal OUT-n, substantially to a power supply potential VDD.

At time t4, boot control signal BC3n may transition from a logic high level to a logic low level. In response to the high to low transition of boot control signal BC3n, boot node NBOOT may transition to a ground potential VSS. With boot node NBOOT at a ground potential VSS, n-channel IGFET N524 may be turned off. At time t5, input signal IN-n may transition to a power supply potential VDD. With input signal IN-n at a power supply potential n-channel IGFET IN-n may be turned on. With n-channel IGFET IN-n turned on, output signal OUT-n may be driven to essentially a ground potential VSS.

In this way, by raising the potential of boot node NBOOT before input signal IN-n transitions to turn off n-channel IGFET N522 and by lowering the potential of boot node NBOOT before input signal IN-n transitions to turn on n-channel IGFET N522, the speed path may be determined by input signal IN-n and inverter 520 may provide a logical inversion of input signal IN-n as an output signal OUT-n. Furthermore, by driving output signal OUT-n only by n-channel IGFETs (N522 and N524) in response to transitions in input signal IN-n, variations in the speed of inverter 520 is substantially determined by n-channel IGFETs (N522 and N524) and their process variations therefore.

Boot circuit 510 may include both p-channel IGFETs and n-channel IGFETs, however, by setting the timing of the potential of boot node NBOOT as explained, the operational speed of inverter 520 may be insubstantially impacted by the process variations of the p-channel IGFETs in boot circuit 510.

Ring oscillator stage 500 may be used in each stage (S1 to Sn) of ring oscillator circuit 400 in FIG. 4 to form a ring oscillator having input signals (IN-1 to IN-n) and output signals (OUT-1 to OUT-n). Input signal IN-n may receive output signal OUT-(n-1) (i.e. the output signal from the previous stage (S1 to Sn). It is noted, that boot control signals (BC1n to BC3n) may simply be leading or lagging output signals (OUT-1 to OUT-n). For example, boot control signal BC1n may be an output signal OUT-(n-l) or "l" stages before the stage (S1 to Sn). Boot control signal BC2n may be an output signal OUT-(n-k) or "k" stages before the stage (S1 to Sn). Boot control signal BC3n may be an output signal OUT-(n-j) or "j" stages before the stage (S1 to Sn).

Figure 7:
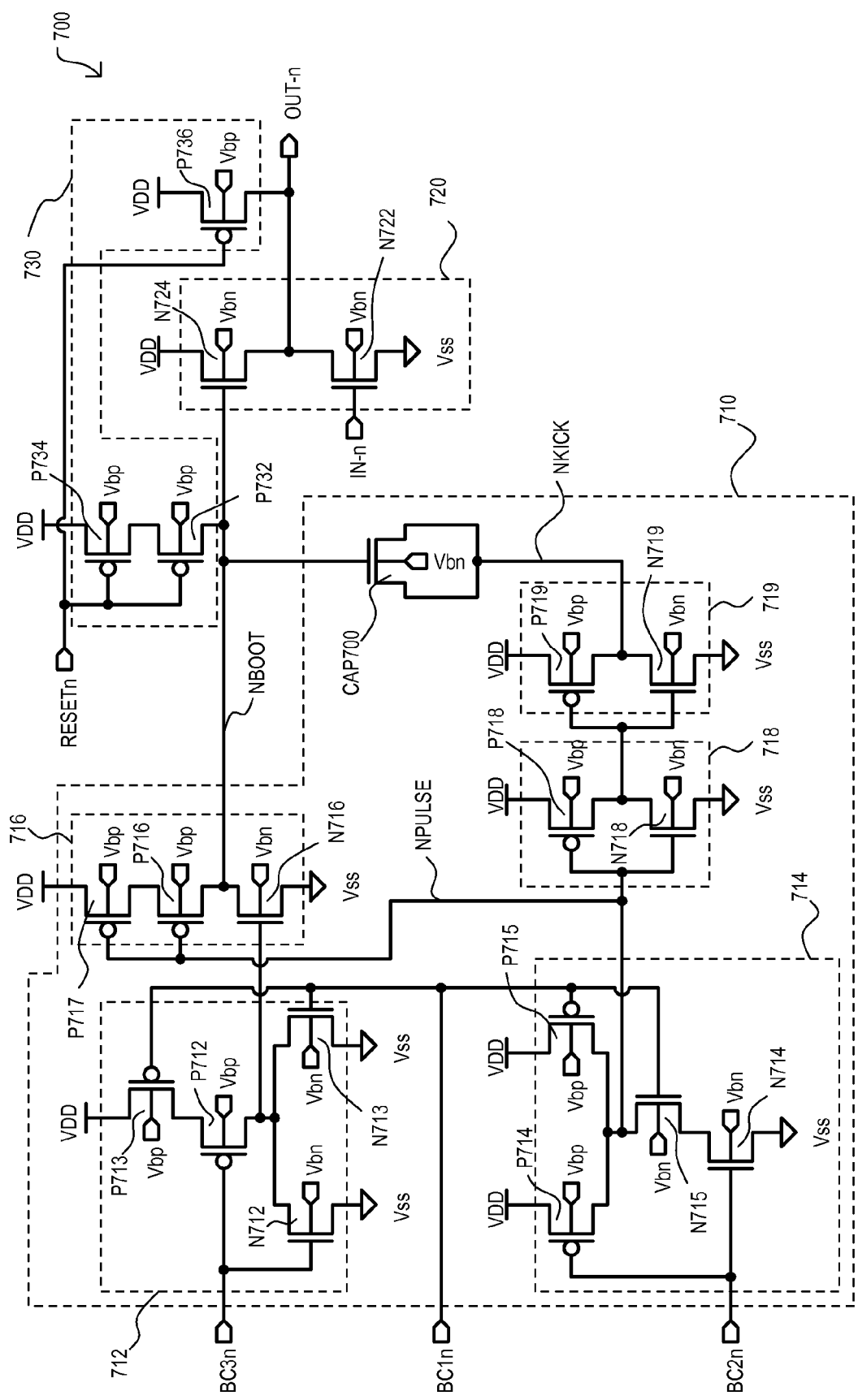
FIG. 7 is a circuit schematic diagram of a ring oscillator stage according to an embodiment.

Referring now to FIG. 7, a ring oscillator stage according to an embodiment is set forth in a circuit schematic diagram and designated by the general reference character 700. Ring oscillator stage 700 may be used for stages (S1 to Sn) in a construction of ring oscillator 400 of FIG. 4. In particular, ring oscillator 400 of FIG. 4, configured with ring oscillator stage 700 may be used as ring oscillator 110 in semiconductor circuit 100 of FIG. 1.

Ring oscillator stage 700 may include a boot circuit 710, an inverter 720, and a reset stage 730.

Boot circuit 710 may receive boot control signals (BC1n, BC2n, and BC3n) and may provide a booted output signal at a boot node NBOOT. Inverter 720 may receive the booted output signal at boot node NBOOT and an input signal IN-n as inputs and may provide an output signal OUT-n as an output. Reset circuit 730 may receive reset signal RESETn as an input and may have outputs connected to boot node NBOOT and output signal OUT-n.

Boot circuit 710 may include NOR logic gate 712, NAND logic gate 714, charge circuit 716, inverters (718 and 719), and capacitor CAP700.

NOR logic gate 712 may receive boot control signals (BC3n and BC1n) as inputs and may provide an output signal. NAND logic gate 714 may receive boot control signals (BC1n and BC2n) as inputs and may provide an output signal. Charge circuit 716 may receive the output signals from NAND logic gate 714 and NOR logic gate 712, respectively, and may provide an output to boot node NBOOT. Inverter 718 may receive the output signal from NAND logic gate 714 as an input and may provide an output signal. Inverter 719 may receive the output signal from inverter 718 and may provide an output signal to a kick node NKICK. Capacitor CAP700 may have a first terminal connected to kick node NKICK and a second terminal connected to boot node NBOOT.

NOR logic gate 712 may include p-channel IGFETs (P712 and P713) connected to receive a body bias potential Vbp at respective body terminals and n-channel IGFETs (N712 and N713) connected to receive a body bias potential Vbn at respective body terminals. N-channel IGFET N712 may have a source terminal connected to ground potential, a gate terminal connected to receive boot control signal BC3n, and a drain terminal commonly connected with drain terminals of n-channel IGFET N713 and p-channel IGFET P712, respectively to provide an output signal. N-channel IGFET N713 may have a source terminal connected to ground potential VSS, and a gate terminal connected to receive boot control signal BC1n. P-channel IGFET P712 may have a source terminal commonly connected to a drain terminal of p-channel IGFET P713 and a gate terminal connected to receive boot control signal BC3n. P-channel IGFET P713 may have a source terminal connected to power supply potential VDD and a gate terminal connected to receive boot control signal BC1n.

NAND logic gate 714 may include p-channel IGFETs (P714 and P715) connected to receive a body bias potential Vbp at respective body terminals and n-channel IGFETs (N714 and N715) connected to receive a body bias potential Vbn at respective body terminals. P-channel IGFET P714 may have a source terminal connected to power supply potential VDD, a gate terminal connected to receive boot control signal BC2n, and a drain terminal commonly connected with drain terminals of p-channel IGFET P715 and n-channel IGFET N715, respectively to provide an output signal at pulse node NPULSE. P-channel IGFET P715 may have a source terminal connected to power supply potential VDD, and a gate terminal connected to receive boot control signal BC1n. N-channel IGFET N715 may have a source terminal commonly connected to a drain terminal of n-channel IGFET N714 and a gate terminal connected to receive boot control signal BC1n. N-channel IGFET N714 may have a source terminal connected to ground potential VSS and a gate terminal connected to receive boot control signal BC2n.

Charge circuit 716 may include p-channel IGFETs (P716 and P717) connected to receive a body bias potential Vbp at respective body terminals and an n-channel IGFET N716 connected to receive a body bias potential Vbn at a body terminal. N-channel IGFET N716 may have a source terminal connected to ground potential VSS, a gate terminal connected to receive the output signal from NOR logic gate 712, and a drain terminal commonly connected to a drain terminal p-channel IGFET P716 to provide an output to boot node NBOOT. P-channel IGFET P716 may have a source terminal commonly connected to a drain terminal of p-channel IGFET P717 and a gate terminal connected to receive the output signal from NAND logic gate 714 at pulse node NPULSE. P-channel IGFET P717 may have a source terminal connected to power supply potential VDD and a gate terminal connected to receive the output signal from NAND logic gate 714 at pulse node NPULSE.

Inverter 718 may include p-channel IGFET P718 connected to receive a body bias potential Vbp at a body terminal and an n-channel IGFET N718 connected to receive a body bias potential Vbn at a body terminal. N-channel IGFET N718 may have a source terminal connected to ground potential VSS, a gate terminal connected to receive the output signal from NAND logic gate 714 at pulse node NPULSE, and a drain terminal commonly connected with a drain terminal of p-channel IGFET P718 to provide an output signal. P-channel IGFET P718 may have a source terminal connected to power supply potential VDD and a gate terminal connected to receive the output signal from NAND logic gate 714 at pulse node NPULSE.

Inverter 719 may include p-channel IGFET P719 connected to receive a body bias potential Vbp at a body terminal and an n-channel IGFET N719 connected to receive a body bias potential Vbn at a body terminal. N-channel IGFET N719 may have a source terminal connected to ground potential VSS, a gate terminal connected to receive the output signal from inverter 718, and a drain terminal commonly connected with a drain terminal of p-channel IGFET P719 to provide an output signal to a kick node NKICK. P-channel IGFET P719 may have a source terminal connected to power supply potential VDD and a gate terminal connected to receive the output signal from inverter 718.

Capacitor CAP700 may include a n-channel IGFET having a source terminal and drain terminal commonly connected to kick node NKICK and a gate terminal connected to boot node NBOOT. The n-channel IGFET of capacitor CAP700 may have a body terminal connected to receive body bias potential Vbn.

Inverter 720 may include n-channel IGFETs (N722 and N724). N-channel IGFET N722 may have a source terminal connected to a ground potential, a drain terminal commonly connected to a source terminal of n-channel IGFET N724, and a gate connected to receive input signal IN-n. N-channel IGFET N724 may have a gate terminal connected to boot node NBOOT and a drain terminal connected to a power supply potential VDD. Each n-channel IGFET (N722 and N724) may have a body terminal connected to a body bias potential Vbn. N-channel IGFET N722 may have a channel region that is substantially greater drive strength than n-channel IGFET N724. As just one example, the width/length ratio of the gate region connected to the gate terminal of n-channel IGFET N722 may be about 8 times larger than the gate region of n-channel IGFET N724.

Reset circuit 730 may include p-channel IGFETs (P732, P734, and P736) connected to receive a body bias potential Vbp at respective body terminals. P-channel IGFET P732 may have a drain terminal connected to boot node NBOOT, a source terminal commonly connected to a drain terminal of p-channel IGFET P734 and a gate terminal commonly connected to a gate terminal of p-channel IGFET P734 to receive a reset signal RESETn. P-channel IGET P734 may have a source terminal connected to power supply potential VDD. P-channel IGFET P736 may have a source terminal connected to power supply potential VDD, a drain terminal connected to the output of inverter 720, and a gate terminal connected to receive reset signal RESETn.

The operation of ring oscillator stage 700 will now be explained with reference to the timing diagrams of FIG. 6.

The ring oscillator stage 700 may be a low voltage ring oscillator stage in which power supply potential VDD may be below 1.0 volt. Power supply potential VDD may be about 0.6 volts, as one particular example.

Before time t1, input signal IN-n may be at a power supply potential VDD, boot control signal BC3n may be at a ground potential VSS, boot control signal BC2n may be at a power supply potential VDD, and boot control signal BC1n may be at a ground potential VSS. Because the gate terminal of n-channel IGFET N722 is receiving the power supply level, n-channel IGFET N722 may be turned on and output signal OUT-n may be driven to a ground potential VSS. With both boot control signals (BC1n and BC3n) at the ground potential (a low logic level), NOR logic gate 712 may provide a logic high output (power supply potential VDD) as an output signal. With n-channel IGFET N716 receiving a power supply potential VDD at a gate terminal a low impedance path to ground is provided to boot node NBOOT. In this way, boot node NBOOT can be at a ground potential VSS. With boot node NBOOT at a ground potential, n-channel IGFET N724 may be turned off.

At t1 boot control signal BC1n may transition from a low logic level (ground potential VSS) to a high logic level (power supply potential VDD). With boot control signal BC1n at a high level, the output signal of NOR logic gate 712 may be driven to a low level or a ground potential VSS. With the gate of n-channel IGFET N716 at ground potential, n-channel IGFET N716 may turn off. Also, with both boot control signals (BC1n and BC2n) at a high level, NAND logic gate 714 may provide a logic low level at essentially a ground potential VSS at pulse node NPULSE. By receiving a ground potential VSS at the gate terminals of p-channel IGFETs (P716 and P717), a low impedance path may be provided between the power supply potential VDD and boot node NBOOT. In this way, capacitor CAP700 may begin to be charged by charging circuit 716. Thus, response to the low to high transition of boot control signal BC1n, boot node NBOOT may transition from a logic low level to a power supply potential VDD. At this time, n-channel IGFET N724 may turn on. However, because n-channel IGFET N722 has a substantially greater drive strength than n-channel IGFET N724, output signal OUT-n may remain substantially at a ground potential VSS. Also, by receiving a low logic level at the input of inverter 718 at pulse node NPULSE, inverter 718 may provide a high logic level output. This high logic level output may be inverted by inverter 719 to provide a low logic level of essentially ground potential VSS at kick node NKICK.

At time t2, boot control signal BC2n may transition from a high logic level to a low logic level. With boot control signal BC2n at a high logic level, NAND logic gate 714 may provide a high logic level at pulse node NPULSE. By receiving a high logic level, p-channel IGFETs (P716 and P717) may turn off and capacitor CAP700 may stop charging. By receiving a high logic level, inverter 718 may provide a logic low level and inverter 719 may provide a logic high level. In this way, boot node NBOOT may transition to a booted potential, substantially above power supply potential VDD. In response to this, n-channel IGFET N724 may turn on harder. However, because n-channel IGFET N722 has a substantially greater drive strength than n-channel IGFET N724, output signal OUT-n may remain substantially at a ground potential VSS.

At time t3, input signal IN-n may transition from a power supply potential VDD to essentially a ground potential VSS. With input signal IN-n at a ground potential, n-channel IGFET N722 may be turned off. With n-channel IGFET N722 turned off, n-channel IGFET N724 may be allowed to pull output signal OUT-n, substantially to a power supply potential VDD.

At time t4, boot control signal BC3n may transition from a logic high level to a logic low level. With boot control signals (BC3n and BC1n) at a logic low level, NOR logic gate 712 may provide a logic high output. With n-channel IGFET N716 receiving a power supply potential VDD at a gate terminal a low impedance path to ground is provided to boot node NBOOT. In this way, boot node NBOOT can return to the ground potential VSS. With boot node NBOOT at a ground potential, n-channel IGFET N724 may be turned off.

At time t5, input signal IN-n may transition to a power supply potential VDD. With input signal IN-n at a power supply potential n-channel IGFET IN-n may be turned on. With n-channel IGFET IN-n turned on, output signal OUT-n may be driven to essentially a ground potential VSS.

As described above, boot control signals (BC1n and BC2n) may be set to provide a low going pulse output signal at pulse node NPULSE between times t1 and t2. Boot control signals (BC1n and BC2n) may be selected to provide a predetermined pulse width to allow capacitor CAP700 to charge sufficiently to allow a predetermined boot potential at boot node BOOT. Boot control signal BC3n may be used to reset the boot node to a ground potential VSS before input signal INn transitions from a logic low to a logic high level.

By raising the potential of boot node NBOOT before input signal IN-n transitions to turn off n-channel IGFET N722 and by lowering the potential of boot node NBOOT before input signal IN-n transitions to turn on n-channel IGFET N722, the speed path may be determined by input signal IN-n and inverter 720 may provide a logical inversion of input signal IN-n as an output signal OUT-n. Furthermore, by driving output signal OUT-n only by n-channel IGFETs (N722 and N724) in response to transitions in input signal IN-n, variations in the speed of inverter 720 is substantially determined by n-channel IGFETs (N722 and N724) and their process variations therefore.

Boot circuit 710 may include both p-channel IGFETs and n-channel IGFETs, however, by setting the timing of the potential of boot node NBOOT as explained, the operational speed of inverter 720 may not be substantially impacted by the process variations of the p-channel IGFETs in boot circuit 710.

Ring oscillator stage 700 may be used in each stage (S1 to Sn) of ring oscillator circuit 400 in FIG. 4 to form a ring oscillator having input signals (IN-1 to IN-n) and output signals (OUT-1 to OUT-n). Input signal IN-n may receive output signal OUT-(n-1) (i.e. the output signal from the previous stage (S1 to Sn). It is noted, that boot control signals (BC1n to BC3n) may simply be leading or lagging output signals (OUT-1 to OUT-n). For example, boot control signal BC1n may be an output signal OUT-(n-l) or "l" stages before the stage (S1 to Sn). Boot control signal BC2n may be an output signal OUT-(n-k) or "k" stages before the stage (S1 to Sn). Boot control signal BC3n may be an output signal OUT-(n-j) or "j" stages before the stage (S1 to Sn).

Figure 8:
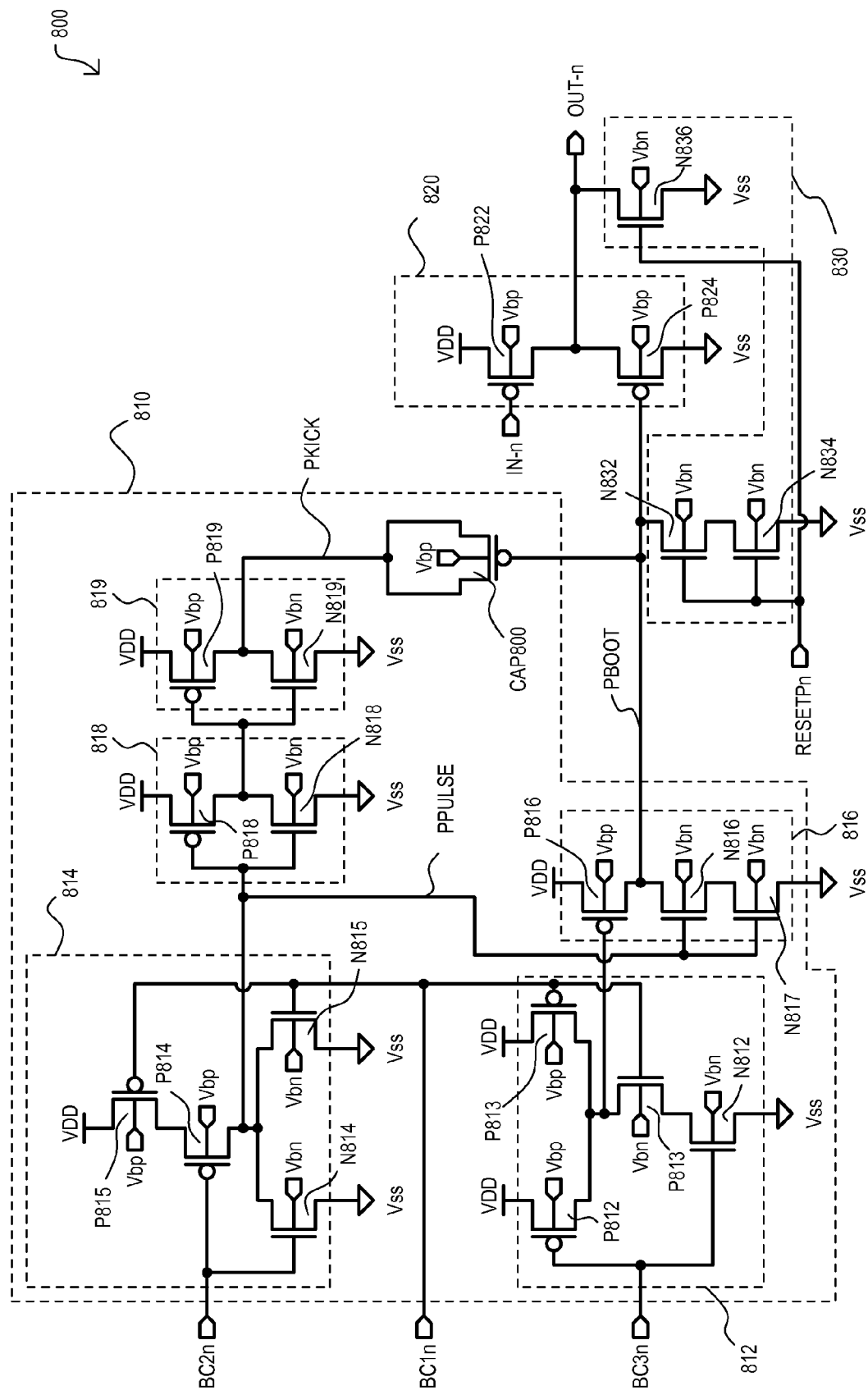
FIG. 8 is a circuit schematic diagram of a ring oscillator stage according to an embodiment.

Referring now to FIG. 8, a ring oscillator stage according to an embodiment is set forth in a circuit schematic diagram and designated by the general reference character 800. Ring oscillator stage 800 may be used for stages (S1 to Sn) in a construction of ring oscillator 400 of FIG. 4. In particular, ring oscillator 400 of FIG. 4, configured with ring oscillator stage 800 may be used as ring oscillator 120 in semiconductor circuit 100 of FIG. 1.

Ring oscillator stage 800 may include a boot stage 810, an inverter 820, and a reset stage 830.

Boot circuit 810 may receive boot control signals (BC1n, BC2n, and BC3n) and may provide a booted output signal at a boot node PBOOT. Inverter 820 may receive the booted output signal at boot node PBOOT and an input signal IN-n as inputs and may provide an output signal OUT-n as an output. Reset circuit 830 may receive reset signal RESETPn as an input and may have outputs connected to boot node PBOOT and output signal OUT-n.

Boot circuit 810 may include NAND logic gate 812, NOR logic gate 814, charge circuit 816, inverters (818 and 819), and capacitor CAP800.

NAND logic gate 812 may receive boot control signals (BC3n and BC1n) as inputs and may provide an output signal. NOR logic gate 814 may receive boot control signals (BC1n and BC2n) as inputs and may provide an output signal. Charge circuit 816 may receive the output signals from NOR logic gate 814 and NAND logic gate 812, respectively, and may provide an output to boot node PBOOT. Inverter 818 may receive the output signal from NOR logic gate 814 as an input and may provide an output signal. Inverter 819 may receive the output signal from inverter 818 and may provide an output signal to a kick node PKICK. Capacitor CAP800 may have a first terminal connected to kick node PKICK and a second terminal connected to boot node PBOOT.

NAND logic gate 812 may include p-channel IGFETs (P812 and P813) connected to receive a body bias potential Vbp at respective body terminals and n-channel IGFETs (N812 and N813) connected to receive a body bias potential Vbn at respective body terminals. P-channel IGFET P812 may have a source terminal connected to power supply potential VDD, a gate terminal connected to receive boot control signal BC3n, and a drain terminal commonly connected with drain terminals of p-channel IGFET P813 and n-channel IGFET P813, respectively to provide an output signal. P-channel IGFET P813 may have a source terminal connected to power supply potential VDD, and a gate terminal connected to receive boot control signal BC1n. N-channel IGFET N813 may have a source terminal commonly connected to a drain terminal of n-channel IGFET N812 and a gate terminal connected to receive boot control signal BC1n. N-channel IGFET N812 may have a source terminal connected to ground potential VSS and a gate terminal connected to receive boot control signal BC3n.

NOR logic gate 814 may include p-channel IGFETs (P814 and P815) connected to receive a body bias potential Vbp at respective body terminals and n-channel IGFETs (N814 and N815) connected to receive a body bias potential Vbn at respective body terminals. N-channel IGFET N814 may have a source terminal connected to ground potential, a gate terminal connected to receive boot control signal BC2n, and a drain terminal commonly connected with drain terminals of n-channel IGFET N815 and p-channel IGFET P814, respectively to provide an output signal at pulse node PPULSE. N-channel IGFET N815 may have a source terminal connected to ground potential VSS, and a gate terminal connected to receive boot control signal BC1n. P-channel IGFET P814 may have a source terminal commonly connected to a drain terminal of p-channel IGFET P815 and a gate terminal connected to receive boot control signal BC2n. P-channel IGFET P815 may have a source terminal connected to power supply potential VDD and a gate terminal connected to receive boot control signal BC1n.

Charge circuit 816 may include n-channel IGFETs (N816 and N817) connected to receive a body bias potential Vbn at respective body terminals and a p-channel IGFET P816 connected to receive a body bias potential Vbp at a body terminal. P-channel IGFET P816 may have a source terminal connected to power supply potential VDD, a gate terminal connected to receive the output signal from NAND logic gate 812, and a drain terminal commonly connected to a drain terminal n-channel IGFET N816 to provide an output to boot node PBOOT. N-channel IGFET N816 may have a source terminal commonly connected to a drain terminal of n-channel IGFET N817 and a gate terminal connected to receive the output signal from NOR logic gate 814 at pulse node PPULSE. N-channel IGFET N817 may have a source terminal connected to ground potential VSS and a gate terminal connected to receive the output signal from NOR logic gate 814 at pulse node PPULSE.

Inverter 818 may include p-channel IGFET P818 connected to receive a body bias potential Vbp at a body terminal and an n-channel IGFET N818 connected to receive a body bias potential Vbn at a body terminal. N-channel IGFET N818 may have a source terminal connected to ground potential VSS, a gate terminal connected to receive the output signal from NOR logic gate 814 at pulse node PPULSE, and a drain terminal commonly connected with a drain terminal of p-channel IGFET P818 to provide an output signal. P-channel IGFET P818 may have a source terminal connected to power supply potential VDD and a gate terminal connected to receive the output signal from NOR logic gate 814 at pulse node PPULSE.

Inverter 819 may include p-channel IGFET P819 connected to receive a body bias potential Vbp at a body terminal and an n-channel IGFET N819 connected to receive a body bias potential Vbn at a body terminal. N-channel IGFET N819 may have a source terminal connected to ground potential VSS, a gate terminal connected to receive the output signal from inverter 818, and a drain terminal commonly connected with a drain terminal of p-channel IGFET P819 to provide an output signal to a kick node PKICK. P-channel IGFET P819 may have a source terminal connected to power supply potential VDD and a gate terminal connected to receive the output signal from inverter 818.

Capacitor CAP800 may include a p-channel IGFET having a source terminal and drain terminal commonly connected to kick node PKICK and a gate terminal connected to boot node PBOOT. The p-channel IGFET of capacitor CAP800 may have a body terminal connected to receive body bias potential Vbp.

Inverter 820 may include p-channel IGFETs (P822 and P824). P-channel IGFET P822 may have a source terminal connected to a power potential VDD, a drain terminal commonly connected to a source terminal of p-channel IGFET P824, and a gate connected to receive input signal IN-n. P-channel IGFET P824 may have a gate terminal connected to boot node PBOOT and a drain terminal connected to a ground potential VSS. Each p-channel IGFET (P822 and P824) may have a body terminal connected to a body bias potential Vbp. P-channel IGFET P822 may have a channel region that is substantially greater drive strength than p-channel IGFET P824. As just one example, the width/length ratio of the gate region connected to the gate terminal of p-channel IGFET P822 may be about 8 times larger than the gate region of p-channel IGFET P824.

Reset circuit 830 may include n-channel IGFETs (N832, N834, and N836) connected to receive a body bias potential Vbn at respective body terminals. N-channel IGFET N832 may have a drain terminal connected to boot node PBOOT, a source terminal commonly connected to a drain terminal of n-channel IGFET N834 and a gate terminal commonly connected to a gate terminal of n-channel IGFET N834 to receive a reset signal RESETPn. N-channel IGET N834 may have a source terminal connected to ground potential VSS. N-channel IGFET N836 may have a source terminal connected to ground potential VSS, a drain terminal connected to the output of inverter 820, and a gate terminal connected to receive reset signal RESETPn.

Ring oscillator stage 800 may operate in essentially the same manner as ring oscillator stage 700 as described previously except the signals may be inverted. As one example the boot signal at boot node PBOOT may be first driven from a power supply potential VSS and then booted to a negative boot potential. In this way, p-channel IGFET P824 may be turned on harder to provide adequate current drive at output signal OUT-n transitioning to a ground potential VSS.

Boot control signals (BC1n and BC2n) may be set to provide a high going pulse output signal at pulse node PPULSE. Boot control signals (BC1n and BC2n) may be selected to provide a predetermined pulse width to allow capacitor CAP800 to charge sufficiently to allow a predetermined negative boot potential at boot node PBOOT. Boot control signal BC3n may be used to reset the boot node PBOOT to a power supply potential VDD before input signal INn transitions from a logic high to a logic low level.

By lowering the potential of boot node PBOOT to a negative boot potential before input signal IN-n transitions to turn off p-channel IGFET P822 and by raising the potential of boot node PBOOT to a power supply potential VDD before input signal IN-n transitions to turn on p-channel IGFET P822, the speed path may be determined by input signal IN-n and inverter 820 may provide a logical inversion of input signal IN-n as an output signal OUT-n. Furthermore, by driving output signal OUT-n only by p-channel IGFETs (P822 and P824) in response to transitions in input signal IN-n, variations in the speed of inverter 820 is substantially determined by p-channel IGFETs (P822 and P824) and their process variations therefore.

Boot circuit 810 may include both p-channel IGFETs and n-channel IGFETs, however, by setting the timing of the potential of boot node PBOOT as explained, the operational speed of inverter 820 may be not be substantially impacted by the process variations of the n-channel IGFETs in boot circuit 810.

Ring oscillator stage 800 may be used in each stage (S1 to Sn) of ring oscillator circuit 400 in FIG. 4 to form a ring oscillator having input signals (IN-1 to IN-n) and output signals (OUT-1 to OUT-n). Input signal IN-n may receive output signal OUT-(n-1) (i.e. the output signal from the previous stage (S1 to Sn). It is noted, that boot control signals (BC1n to BC3n) may simply be leading or lagging output signals (OUT-1 to OUT-n). For example, boot control signal BC1n may be an output signal OUT-(n-l) or "l" stages before the stage (S1 to Sn). Boot control signal BC2n may be an output signal OUT-(n-k) or "k" stages before the stage (S1 to Sn). Boot control signal BC3n may be an output signal OUT-(n-j) or "j" stages before the stage (S1 to Sn).

Referring now to FIG. 9, a table setting forth simulation results is set forth and designated by the general reference character 900. Table 900 illustrates simulation results of a 63 stage ring oscillator including the ring oscillator stage 700 of FIG. 7 for each ring oscillator stage. The simulation results were performed at a temperature of 25° C., a power supply potential VDD of 0.9 volt, and a body bias potentials (Vbn and Vbp) of 0.0 volt and 0.9 volt, respectively.

The first column indicates fast or slow corner n-channel IGFET, the second column indicates fast or slow corner p-channel IGFET, and the third column indicates the period of oscillation of the output OSCOUTN (FIG. 1) of the ring oscillator. As can be seen, when a fast corner n-channel IGFET is used in the simulation, the period does not substantially change regardless as to the fast or slow corner p-channel IGFET used (e.g. 3.545 ns and 3.518 ns). Likewise, when a slow corner n-channel IGFET is used in the simulation, the period does not substantially change regardless as to the fast or slow corner p-channel IGFET used (e.g. 6.969 ns and 6.725 ns). The period does change substantially as to whether a fast corner or a slow corner n-channel IGFET is used (eg. about 3.5 ns and about 6.9 ns, respectively). It is noted that the period and therefore the frequency of oscillation only substantially changes according to process variations of the n-channel IGFETs, but not due to the process variations of the p-channel IGFETs.

For reference, a simulation using typical n-channel IGFETs and typical p-channel IGFETs is included that shows a period of oscillation of about 5.0 ns. This data may be used to determine how to program the programmable circuits132 in voltage generator 130 in the semiconductor circuit 100 of FIG. 1.

Referring now to FIG. 10, a table setting forth simulation results is set forth and designated by the general reference character 1000. Table 1000 illustrates simulation results of a 63 stage ring oscillator including the ring oscillator stage 800 of FIG. 8 for each ring oscillator stage. The simulation results were performed at a temperature of 25° C., a power supply potential VDD of 0.9 volt, and a body bias potentials (Vbn and Vbp) of 0.0 volt and 0.9 volt, respectively.

The first column indicates fast or slow corner p-channel IGFET, the second column indicated fast or slow corner n-channel IGFET, and the third column indicates the period of oscillation of the output OSCOUTP (FIG. 1) of the ring oscillator. As can be seen, when a fast corner p-channel IGFET is used in the simulation, the period does not substantially change regardless as to the fast or slow corner n-channel IGFET used (e.g. 6.546 ns and 6.45 ns). Likewise, when a slow corner p-channel IGFET is used in the simulation, the period does not substantially change regardless as to the fast or slow corner n-channel IGFET used (e.g. 17.833 ns and 16.366 ns). The period does change substantially as to whether a fast corner or a slow corner p-channel IGFET used (eg. about 6.5 ns and about 17 ns, respectively). It is noted that the period and therefore the frequency of oscillation only substantially changes according to process variations of the p-channel IGFETs, but not due to the process variations of the n-channel IGFETs.

For reference, a simulation using typical p-channel IGFETs and typical n-channel IGFETs is included that shows a period of oscillation of about 5.0 ns. This data may be used to determine how to program the programmable circuits 142 in voltage generator 140 in the semiconductor circuit 100 of FIG. 1.

The appearance of the phrase "in one embodiment" in various places in the specification do not necessarily refer to the same embodiment. The term "to couple" or "electrically connect" as used herein may include both to directly and to indirectly connect through one or more intervening components. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Accordingly, the specifications and drawings are to be regarded in an illustrative rather than a restrictive sense.

What is claimed is:

1. A method of setting a body bias potential, comprising the step of:
   determining the frequency of a first ring oscillator by probing an output pad coupled to the ring oscillator;
   setting a first predetermined body bias potential for a first conductivity type insulated gate field effect transistor (IGFET) in response to the frequency of the first ring oscillator by programming a first programmable voltage generator that provides the first predetermined body biased potential based on a first programming state; and
   providing a supply voltage to the ring oscillator of less than 1.0 volt.

2. The method of claim 1, wherein
   the IGFET includes a structure having a gate overlying a channel, wherein the channel comprises a substantially undoped channel having a relatively high mobility and a heavily doped screen layer lying a predetermined distance below the transistor gate; and
   the channel includes a heavily doped region at a dopant concentration sufficient to define a depletion depth when a voltage is applied to the gate.

3. The method of claim 1, further including the step of:
   dicing a wafer wherein the first ring oscillator is located in a scribe line of the wafer and the first ring oscillator is destroyed in the step of dicing.

4. The method of claim 1, further including the step of:
   setting a second predetermined body bias potential for a second conductivity type insulated gate field effect transistor (IGFET) in response to a frequency of a second ring oscillator.

5. The method of claim 4, wherein:
   the step of setting a second predetermined body bias potential can include programming a second programmable voltage generator that provides the second predetermined body bias potential based on a second programming state.

6. A method of claim 4, further including the step of:
   determining the frequency of the first ring oscillator; and
   determining the frequency of the second ring oscillator wherein
      the frequency of the first ring oscillator is substantially determined by characteristics of at least one IGFET of the first conductivity type and the frequency of the second ring oscillator is substantially determined by characteristics of at least one IGFET of the second conductivity type.

7. The method of claim 4, wherein:
   the first conductivity type IGFET further including a first heavily doped region and structure below a first substantially undoped channel; and
   the second conductivity type IGFET further including a second heavily doped region and structure below a second substantially undoped channel.

8. A ring oscillator circuit including a plurality of ring oscillator stages, at least one ring oscillator stage comprising:
   an inverter circuit coupled to receive an output from a first previous output terminal of a first previous ring oscillator stage at an input terminal and provide an output at an output terminal coupled to a subsequent input terminal of a subsequent ring oscillator stage, the inverter circuit including
      a first insulated gate field effect transistor (IGFET) having a first conductivity type, the first IGFET having a source terminal coupled to a first potential, a drain terminal coupled to the output terminal, and a gate terminal coupled to the input terminal; and
      a second IGFET of the first conductivity type having a source terminal coupled to the output terminal, a drain terminal coupled to a second potential, and a gate terminal coupled to a boot node, the boot node receives a boosted potential outside the bounds of the first potential and the second potential.

9. The ring oscillator circuit of claim 8, wherein:
   the at least one ring oscillator stage further includes
      a boot circuit coupled to receive a first boot control signal and provide the boosted potential.

10. The ring oscillator circuit of claim 9, wherein:
    the first boot control signal is provided by a second previous output terminal of a second previous ring oscillator stage.

11. The ring oscillator circuit of claim 9, wherein:
    the boot circuit includes a boot capacitor having a first terminal coupled to the boot node.

12. The ring oscillator circuit of claim 11, wherein:
    the boot capacitor is formed from a third IGFET having the first conductivity type.

13. The ring oscillator circuit of claim 11, wherein:
    the boot circuit further includes
       a first logic gate coupled to receive the first boot control signal and a second boot control signal and provides a first logic gate output; and
       a charge circuit coupled to receive the first logic gate output at an input and having an output coupled to the first terminal of the boot node, the charge circuit provides charge to the first terminal of the boot capacitor.

14. The ring oscillator circuit of claim 13, wherein:
    the first boot control signal is provided by a second previous output terminal of a second previous ring oscillator stage; and
    the second boot control signal is provided by a third previous output terminal of a third previous ring oscillator stage.

15. The ring oscillator circuit of claim 14, wherein:
    the first logic gate provides a first logic gate output having a predetermined pulse width at a first logic level and the charging circuit charges the first terminal of the boot capacitor in response to the first logic gate output having the first logic level.

16. The ring oscillator circuit of claim 13, wherein:
    the boot control circuit further includes a boot drive circuit having an input coupled to receive the first logic gate output and providing a kick output to a second terminal of the boot capacitor.

17. The ring oscillator circuit of claim 9, wherein:
the boot circuit includes at least one IGFET having a second conductivity type and the inverter circuit has a propagation delay substantially determined by characteristics of IGFETs of the first conductivity type without substantially being affected by characteristics of IGFETs of the second conductivity type and a potential difference between the first potential and the second potential is less than 1.0 volt.

* * * * *